United States Patent
Lee et al.

(10) Patent No.: US 9,209,793 B2
(45) Date of Patent: Dec. 8, 2015

(54) BOOTSTRAP CIRCUITRY FOR AN IGBT

(75) Inventors: Jong-Mu Lee, Seoul (KR); Man-Kee Kim, Yongin (KR)

(73) Assignee: Infineon Technologies Austria AG, Villach (AT)

( * ) Notice: Subject to any disclaimer, the term of this patent is extended or adjusted under 35 U.S.C. 154(b) by 924 days.

(21) Appl. No.: 13/399,463

(22) Filed: Feb. 17, 2012

(65) Prior Publication Data
US 2013/0214757 A1    Aug. 22, 2013

(51) Int. Cl.
*H03K 17/06* (2006.01)

(52) U.S. Cl.
CPC .......... *H03K 17/06* (2013.01); *H03K 2017/066* (2013.01); *H03K 2217/0063* (2013.01); *H03K 2217/0081* (2013.01)

(58) Field of Classification Search
CPC .............. H03K 2217/0063; H03K 2217/0081; H02M 1/08; G05F 1/618; G05F 3/02
USPC .............. 323/224, 311; 327/390, 589; 326/88
See application file for complete search history.

(56) References Cited

U.S. PATENT DOCUMENTS

| | | | |
|---|---|---|---|
| 5,455,758 A * | 10/1995 | Pelly | 363/47 |
| 7,215,189 B2 | 5/2007 | Wilhelm | |
| 7,248,093 B2 * | 7/2007 | West | 327/390 |
| 7,944,250 B2 | 5/2011 | Jansen | |
| 2006/0034107 A1 | 2/2006 | West | |
| 2010/0289560 A1 | 11/2010 | Mavencamp et al. | |

FOREIGN PATENT DOCUMENTS

| | | |
|---|---|---|
| CN | 1879111 A | 12/2006 |
| CN | 101465597 A | 6/2009 |
| JP | 2007318891 A | 12/2007 |

OTHER PUBLICATIONS

DT92-3 ("Using standard control ICs to generate negative gate bias for MOSFETs and IGBTs," International Rectifier, Mar. 2003).*

* cited by examiner

*Primary Examiner* — Adolf Berhane
*Assistant Examiner* — Jye-June Lee
(74) *Attorney, Agent, or Firm* — Slater & Matsil, L.L.P.

(57) ABSTRACT

A bootstrap circuit provides a gate-emitter voltage to the high-side IGBT of a half-bridge IGBT arrangement. The bootstrap circuit includes a buck-boost circuit for providing a negative gate-emitter voltage for turning the high-side IGBT off.

21 Claims, 2 Drawing Sheets

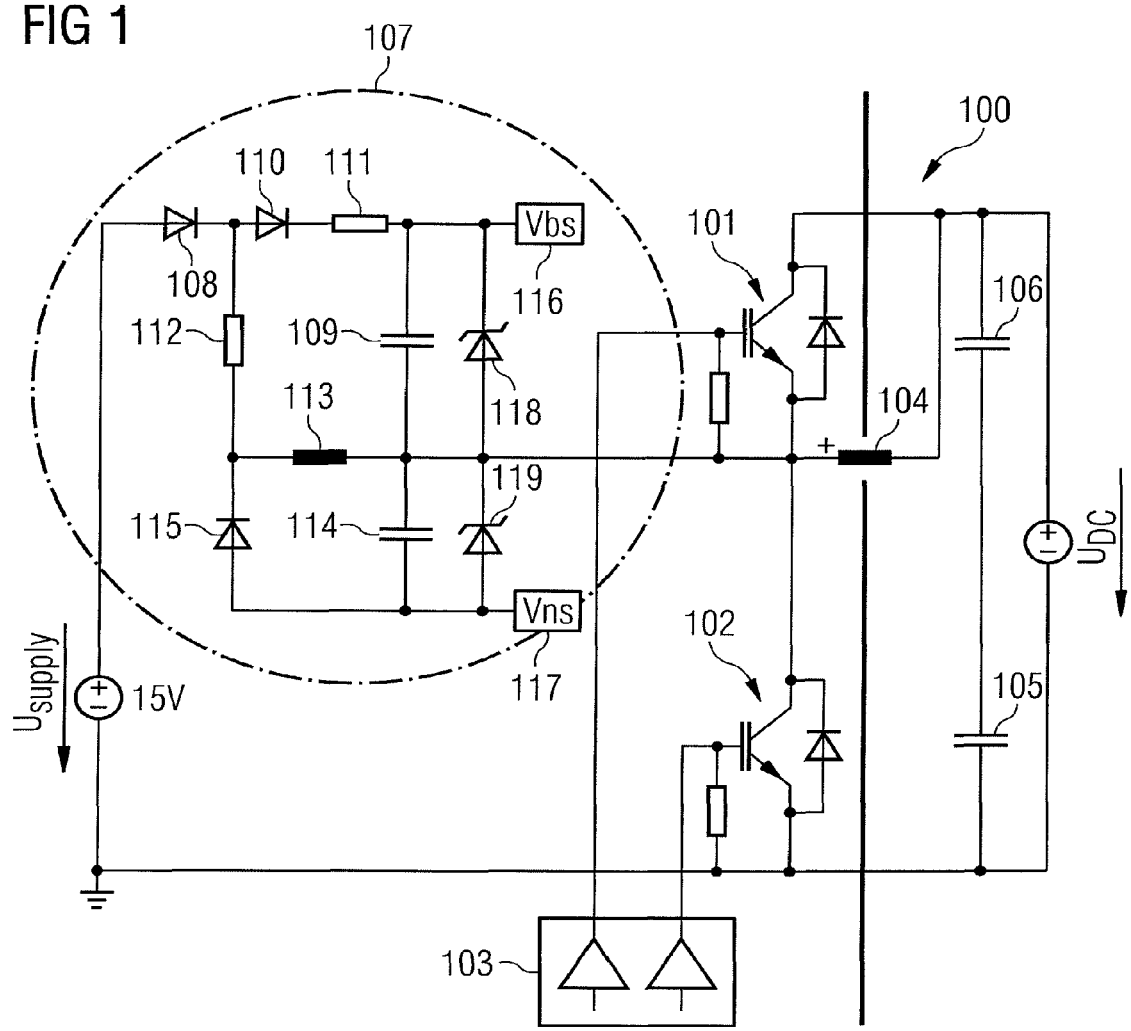

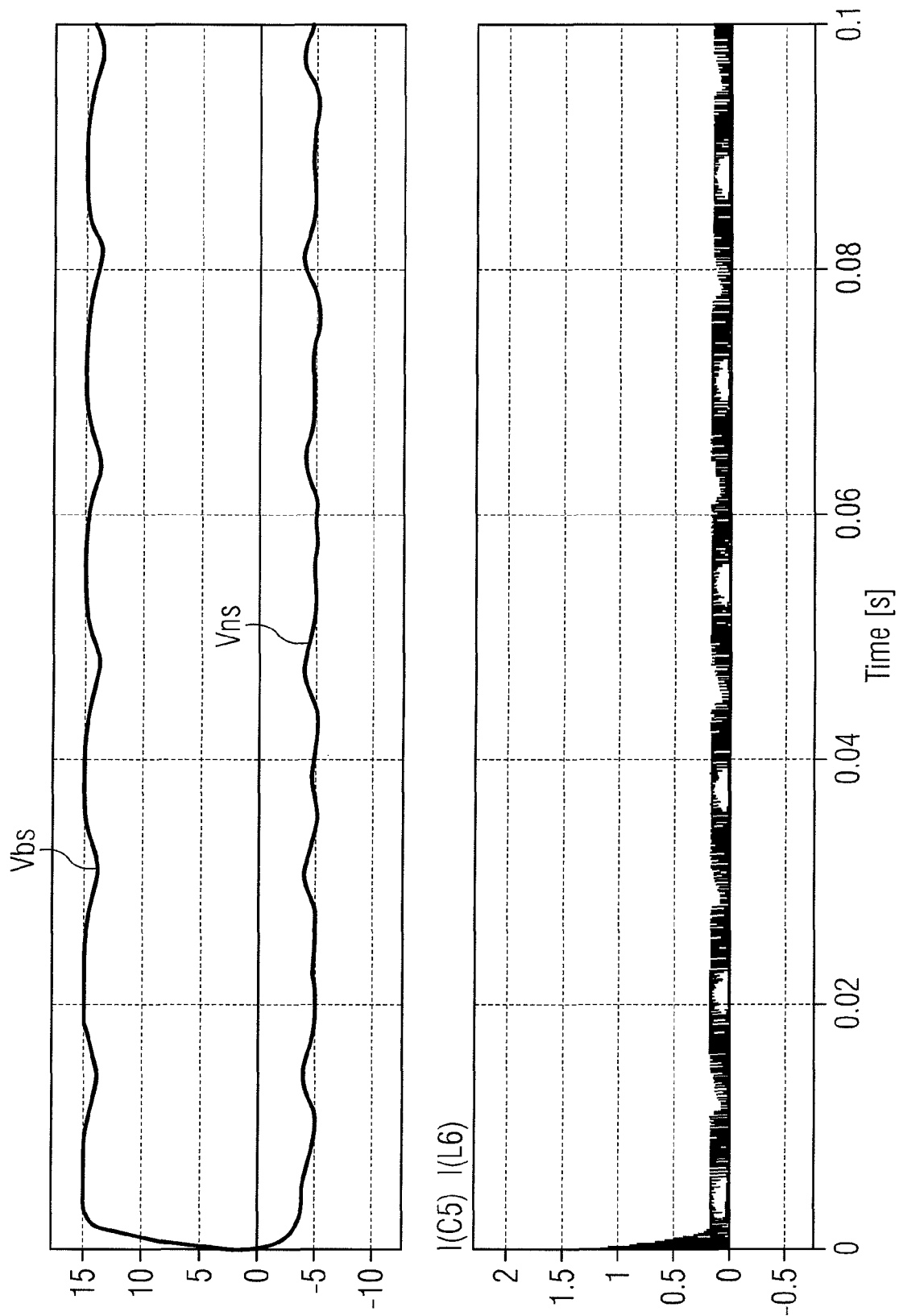

BOOTSTRAP CIRCUITRY FOR AN IGBT

TECHNICAL FIELD

The present invention relates generally to electronics and, in particular embodiments, to a bootstrap circuitry of an IGBT.

BACKGROUND

Insulated gate bipolar transistors, short IGBTs, have been established as semiconductor power switches, i.e., for switching high currents at high voltages. Typical applications include switched circuits such as in power converter systems, for example, switched power mode supplies, short SPMSs. In these applications an IGBT typically is switched on and off in fast succession. Accordingly the switching characteristics are of interest.

In one embodiment IGBTs are used in switched mode power supplies, wherein two IGBTs are arranged in a half-bridge configuration, i.e., a high-side IGBT is coupled with its collector to the anode of a direct voltage source, the high-side IGBT's emitter is connected to the collector of a low-side IGBT, and the low-side IGBT's emitter is coupled to reference ground. By alternately turning the IGBTs on and off the coupling point between the IGBTs can be switched to the voltage of the direct current source or to reference ground. The resulting voltage at that coupling point can be smoothed by using a smoothing capacitor.

Basically an IGBT can be switched from its non-conducting state, i.e., the so-called off-state, to its conducting on-state by applying a positive gate-emitter voltage higher than the threshold voltage, i.e., in this way an IGBT can be turned on. To turn an IGBT off, i.e., to switch an IGBT from its on-state to its off-state, a zero voltage or a negative base-emitter voltage can be applied to an IGBT.

The IGBTs can be controlled using pulse width modulated signals of opposite phase, so the high-side IGBT is switched to a conducting state, i.e., switched to its on-state, while the low-side IGBT is switched to its off-state and vice versa. Due to the alternate switching, the voltage at the connection point switches between reference ground and the voltage of the voltage source.

For providing control voltages to drive the high-side IGBT, i.e., for providing a gate-emitter voltage to the high-side IGBT, a bootstrap circuit can be used, which provides voltages referenced to the connection point of the half-bridge arrangement of the IGBTs. However, when using unipolar gate driving a parasitic current oscillation during the turn-on transient of the IGBT, an unintended parasitic turn-on can be caused by high voltage-rise across the IGBT switch due to the Miller effect. To remove the parasitic current oscillation, a negative gate voltage is required at the high-side IGBT. To prevent an IGBT from unintended parasitic turn-on caused by the Miller effect, a Miller clamp can be provided. However, these solutions have drawbacks. In order to provide a negative gate voltage an SMPS needs to have an increased power rating and additional circuitry, the SMPS thus getting more complex and costly. Also the Miller clamp causes additional circuitry in the boot-strap circuit thus further increasing complexity and costs.

Hence an improved boot-strap circuit is needed that allows to remedy the above problems while using as few components as possible.

SUMMARY OF THE INVENTION

In one aspect, the invention relates to a bootstrap circuit for providing drive voltages to control a high-side IGBT of a half-bridge arrangement of IGBTs. The bootstrap circuit comprises a buck-boost circuit portion providing a negative voltage usable for switching the high-side IGBT off, thus improving the switching characteristics of the half-bridge arrangement.

BRIEF DESCRIPTION OF THE DRAWINGS

The features, aspects and advantages of the present invention will be better understood with regard to the drawings.

FIG. 1 depicts a schematic sketch of a bootstrap circuit according to the invention; and FIG. 2 depicts curves of a positive and a negative voltage as provided by the bootstrap circuit.

DETAILED DESCRIPTION OF ILLUSTRATIVE EMBODIMENTS

FIG. 1 depicts a schematic sketch of a switched mode power supply circuit 100. The SMPS circuit 100 comprises a high-side IGBT (insulated gate bipolar transistor) 101 and a low-side IGBT 102 in half-bridge configuration, i.e., the emitter of high-side IGBT 101 is coupled to the collector of low-side IGBT 102 thus forming a connection point. The collector of high-side IGBT 101 is coupled to the positive electrode of a DC voltage source UDC and the emitter of low-side IGBT 102 is coupled to the negative electrode of the voltage source. In the depicted embodiment both IGBTs are of the n-channel type, although the invention is not limited in this regard. Controller 103 provides gate signals to both IGBTs to alternately couple the connection point to the positive or negative electrode of voltage source UDC. This can be achieved by providing pulse width modulated signals of opposite phase to the base electrodes of the IGBTs. In this way a load 104, which is coupled with its one electrode to the connection point, can be supplied with a switched voltage.

Note that in this embodiment load 104 is modeled as an inductance, which reflects most real life loads. However, loads of other characteristics can be coupled to the SMPS also, so the invention shall not be limited in this regard. Furthermore capacitors 105 and 106, which are provided for smoothing the voltage provided to the load, are not a requirement in the application.

The SMPS circuit 100 furthermore comprises a bootstrap circuit 107 as encircled by the dashed oval. Bootstrap circuit 107 is coupled at one side to a supply voltage $U_{SUPPLY}$, which typically reflects the base-emitter voltage swing required for switching an IGBT to its on-stage. In one embodiment the voltage swing $U_{SUPPLY}$ may be around 15 V. At its other side the bootstrap circuit is coupled to the connection point of half-bridge, i.e., where the emitter of high-side IGBT 101 is coupled to the collector of low-side IGBT 102.

The bootstrap circuit 107 comprises a bootstrap diode $D_{bs}$ 108 that allows a charging current to flow from bootstrap supply voltage across the bootstrap circuit when the low-side IGBT is in its on-state, i.e., conducting. Note that diode 108 is dimensioned for a voltage higher than the DC voltage $U_{DC}$. In one embodiment diode 108 can be designed for a voltage being twice UDC.

Furthermore the bootstrap circuit 107 comprises a first charge path connecting the cathode of the bootstrap diode with the connection point. The first charge path comprises a first bootstrap capacitor $C_{bs}$ 109 coupled in series with a first charge diode 110 and a first charge resistor 111, wherein charge resistor 111 defines the charging current when bootstrap capacitor 109 is charged.

Note that the bootstrap capacitor $C_{bs}$ 109 is dimensioned sufficiently large to meet the energy requirement of the high-side for a complete cycle. In one embodiment $C_{bs}$ 109 may be dimensioned to provide a capacity of 47 nF, i.e., 47 nano Farad. Charge resistor 111 in one embodiment may be dimensioned to have a resistance of 10 Ω.

Furthermore the bootstrap circuit 107 comprises a second charge path from the cathode of bootstrap diode 108 to the connection point, the second charge path thus being parallel to the first charge path. The second charge path comprises a second charge resistor 112 coupled in series with a parallel arrangement of an inductor 113 and capacitor $C_{se}$ 114 in series with second charge diode 115. Second charge resistor 112 controls the current flow through inductor 113 when charging. In one embodiment the second charge resistor 112 may have a resistance value of 100 Ω and inductor 113 may have an inductance value of 680 nano Henry.

When operating the bootstrap circuit 107, i.e., when operating the SMPS 100, the first charge path provides a positive voltage $V_{bs}$ at 116, i.e., at the first bootstrap capacitor 109, and the second charge path provides a negative Voltage $V_{ns}$ at 117, i.e., at the second bootstrap capacitor 114. The positive voltage $V_{bs}$ and the negative voltage $V_{ns}$, are provided (not shown) to controller 103, which uses these as gate voltages for controlling the high-side IGBT as explained in more detail below.

In the initial cycle, i.e., when switching circuit 100 on thus starting the first cycle, controller 103 controls the high-side IGBT 101 to its off-state and controls the low-side IGBT 102 to its on-state, for example by applying a zero gate-emitter voltage to IGBT 101 and a positive gate-emitter voltage exceeding the threshold voltage to low-side IGBT 102. When high-side IGBT 101 is off, i.e., blocking, and low-side IGBT 102 is on, i.e., conducting, the connection point is coupled to reference ground. Then a current flows from the supply voltage $U_{SUPPLY}$ through bootstrap diode 108. A first portion of the current flows through the first charging path, i.e. through first charge diode 110 and first charge resistor 111 and then charges the first bootstrap capacitor 109. The first portion of the current then leaves the bootstrap circuit 107 and flows via the low-side IGBT 102 to the supply voltage source $U_{SUPPLY}$. Depending on the duration of the initial cycle the first bootstrap capacitor 109 is charged to nearly the supply voltage less the voltage drop across bootstrap diode 108 and first charge diode 110. The charged voltage $V_{bs}$ 116 across first bootstrap capacitor 109 is coupled to controller 103 and is the positive supply voltage of the high-side IGBT driver for turning on the high-side IGBT 101 in the next cycle; note that $V_{bs}$ is coupled from 116 to controller 103.

While the first portion of the current charges the first bootstrap capacitor 109, the residual portion of the current from $U_{SUPPLY}$ flows through the second charge path, i.e., through second charge resistor 112 and through inductor 113. That current flow charges inductor 113. Note that during this cycle there is no current flow through second bootstrap capacitor 114, since second charge diode 115 is blocking that current direction.

In the next cycle, i.e., the second cycle, high-side IGBT 101 is turned on, i.e., switched to its conducting state, by coupling $V_{bs}$ to the gate of high-side IGBT 101 as gate-emitter voltage. At the same time low-side IGBT 102 is turned off, i.e., switched from its conducting to its non-conducting state, thus isolating the connection point from reference ground. Switching of the low-side IGBT 102 can be achieved by applying a zero voltage with reference to ground to the gate of the low-side IGBT 102. Then the voltage of the connection point with reference to ground will accordingly rise to $U_{DC}$ exhibiting a fast voltage rise. However, that voltage rise does not affect the gate-emitter voltage $U_{bs}$, since that is referenced to the connection point.

Turning the low-side IGBT 102 off stops the current flow emitting from the supply voltage source $U_{SUPPLY}$. However the current flow through inductor 113 cannot abruptly stop, due to the nature of inductor 113, but will flow through second bootstrap capacitor 114 thus charging the capacitor. Note that second charge diode 115 is arranged to allow this current flow. Further note that the current through inductor 113 does not affect the charge, i.e., the voltage, of the first bootstrap capacitor 109 as this current flow direction is blocked by first charge diode 110 in the first charge path. In this way the energy stored in inductor 113 moves into capacitor 114. Further note that voltage $V_{ns}$, i.e., at 117, with reference to the connection point is negative with reference to the connection point.

In the next cycle, i.e., in the third cycle, high-side IGBT 101 is turned off again and low-side IGBT 102 is turned on. Turning low-side IGBT 102 on can be achieved easily by applying a positive gate-emitter voltage referenced to ground, since the emitter of low-side IGBT is coupled to reference ground.

In order to turn off the high-side IGBT 101, voltage $V_{ns}$ is coupled as gate-emitter voltage to high-side IGBT 101. Note that this negative voltage $V_{ns}$ is not affected by any voltage drop of the connection point with reference to ground caused by turning low-side IGBT 102 on and high-side IGBT 101 off, since $V_{ns}$ is referenced to the connection point. Accordingly the negative gate-emitter voltage $V_{ns}$ remains negative even when the voltage of the connection point changes. By applying the negative gate-emitter voltage to the high-side IGBT 101 upon switching that IGBT off significantly reduces the risk of an unintended parasitic turn-on caused by the Miller effect.

In this way the second charge path forms a so-called buck-boost circuit, which provides a negative voltage $V_{ns}$ that can be used for turning off the high-side IGBT 101 safely, thus improving the switching characteristics of the half-bridge arrangement of IGBTs.

Optionally bootstrap circuit 107 may furthermore comprise a first zener diode 118 to limit the voltage swing of $V_{bs}$. In one embodiment the first zener diode 118 may be dimensioned to have a breakthrough voltage of 15 Volts. Furthermore bootstrap circuit 107 may comprise second zener diode 119 to limit the voltage swing of $V_{ns}$. In one embodiment the second zener diode 119 may be dimensioned to have a breakthrough voltage of 5 Volts.

FIG. 2 depicts a sketch of the simulated voltages Vbs and Vns, i.e., the positive bootstrap voltage applied to the gate of high-side IGBT 101 for turning the IGBT on and the negative voltage applied to the gate of high-side IGBT 101 for turning the IGBT off, when using passive components having values as described above, i.e., $U_{SUPPLY}$ is 15V, first charge resistor 111 is 10 ohm, first bootstrap capacitor 109 is 47 nF, second charge resistor 112 is 100 ohm, inductor 113 is 113 nH and second bootstrap capacitor 114 is 10 nF.

As illustrated in the curves, $V_{bs}$ in the first cycle reaches a voltage of nearly 15 Volts, which is nearly $U_{SUPPLY}$, while $V_{ns}$ drops to a voltage of −5 Volts, both voltages referenced to the connection point. Throughout the switch cycles $V_{bs}$ drops a bit and negative voltage $V_{ns}$ decreases a bit towards zero Volt, but both voltages essentially remain as desired, i.e., $V_{bs}$ essential remains at or shortly below $U_{SUPPPLY}$ and $V_{ns}$ always remains close to −5 Volts.

What is claimed is:

1. A bootstrap circuit for providing a drive voltage to a high-side transistor of a half-bridge arrangement, the bootstrap circuit comprising a buck-boost circuit configured to provide a negative drive voltage for turning the high-side transistor off via a negative supply node, wherein the buck-boost circuit comprises a first capacitor coupled between an output node of the half-bridge arrangement and the negative supply node, an inductor having a first terminal coupled to the output node of the half-bridge arrangement, and a diode coupled between a second terminal of the inductor and the negative supply node.

2. The bootstrap circuit of claim 1, wherein the buck-boost circuit is arranged in parallel to a series circuit that includes a first charge capacitor and a first charge resistor.

3. The bootstrap circuit of claim 1, wherein the buck-boost circuit is coupled to a bootstrap voltage supply via a bootstrap diode, the bootstrap diode arranged to allow a current flow through the bootstrap circuit when a low-side IGBT of the half-bridge arrangement is turned on.

4. The bootstrap circuit of claim 1, wherein the inductor is arranged to charge the first capacitor when the high-side transistor is turned on, wherein the bootstrap circuit is configured to provide a voltage of the first capacitor to the high-side transistor when switching the high-side transistor off.

5. The bootstrap circuit of claim 1, further comprising at least one of a first zener diode arranged to limit a voltage swing of a positive voltage applied to a control node of the high-side transistor and a second zener diode arranged to limit the voltage swing of a negative voltage applied to a control node of the high-side transistor.

6. The bootstrap circuit of claim 1, further comprising the high-side transistor.

7. The bootstrap circuit of claim 6, wherein the high-side transistor comprises an insulated gate bipolar transistor (IGBT).

8. A switched mode power supply comprising a half-bridge IGBT arrangement and a bootstrap circuit, the bootstrap circuit comprising a first charge path arranged for providing a positive voltage to a gate of a high-side IGBT of the half-bridge IGBT arrangement and a second charge path arranged for providing a negative voltage to the gate of the high-side IGBT of the half-bridge IGBT arrangement, wherein the second charge path comprises an inductor arranged in parallel with a series circuit that includes a second bootstrap capacitor and a second charge diode.

9. The switched mode power supply of claim 8, wherein the first and second charge paths are coupled via a bootstrap diode to a bootstrap supply voltage, wherein the bootstrap diode is arranged to provide a current flow when the high-side IGBT is switched on.

10. The switched mode power supply of claim 9, wherein the first charge path comprises a first charge resistor in series with a first bootstrap capacitor.

11. The switched mode power supply of claim 10, wherein the second charge diode is arranged to allow a current flow through the second bootstrap capacitor when the high-side IGBT is turned on.

12. The switched mode power supply of claim 8, wherein the bootstrap circuit comprises at least one of a first zener diode arranged to limit a voltage swing of the positive voltage applied to the gate of the high-side IGBT and a second zener diode arranged to limit a voltage swing of the negative voltage applied to a gate of a low-side IGBT of the half-bridge IGBT arrangement.

13. A circuit to control a switched mode power supply comprising a high-side IGBT and a low-side IGBT in half-bridge arrangement, the circuit comprising circuitry comprising first circuit for providing a positive gate voltage to the high-side IGBT and second circuit for providing a negative gate voltage to the high-side IGBT, wherein the second circuit for providing the negative gate voltage comprises an inductor arranged in parallel with a series circuit that includes a first bootstrap capacitor and a first charge diode.

14. The circuit of claim 13, wherein the first circuit for providing the positive gate voltage comprises a first circuit for storing energy and the second circuit for providing the negative gate voltage comprises second means for storing energy, wherein the first circuit for storing energy is charged when the high-side IGBT is turned off.

15. The circuit of claim 14, wherein the second circuit for storing energy is charged when the high-side IGBT is turned on.

16. The circuit of claim 13, wherein the first circuit for providing the positive gate voltage comprises a second bootstrap capacitor.

17. The circuit of claim 13, further comprising a circuit for limiting a voltage swing of the positive gate voltage applied to the high-side IGBT and a circuit for limiting a voltage swing of the negative gate voltage applied to the high-side IGBT.

18. A method for operating a switched mode power supply comprising a high-side IGBT and a low-side IGBT arranged in a half-bridge arrangement, the method comprising:
charging a first bootstrap capacitor by a bootstrap supply voltage when the high-side IGBT is turned off;
charging an inductor with the bootstrap supply voltage when the high-side IGBT is turned off;
applying a voltage of the first bootstrap capacitor to a gate of the high-side IGBT for turning the high-side IGBT on;
charging a second bootstrap capacitor by the inductor when turning the high-side IGBT off, wherein the inductor is arranged in parallel with a series circuit that includes the second bootstrap capacitor and a diode; and
applying a voltage of the second bootstrap capacitor as a negative voltage to the gate of the high-side IGBT.

19. The method of claim 18, wherein, at start-up of the switched mode power supply, the high-side IGBT is turned off and the low-side IGBT is turned on.

20. The method of claim 18, wherein a voltage swing of a positive voltage applied to the gate of the high-side IGBT is limited by a first voltage limiting circuit.

21. The method of claim 18, wherein a voltage swing of a negative voltage applied to the gate of the high-side IGBT is limited by a second voltage limiting circuit.

* * * * *